United States Patent
Noda (10) Patent No.: US 7,558,997 B2
(45) Date of Patent: Jul. 7, 2009

(54) WIRING STRUCTURE AND METHOD OF SEMICONDUCTOR INTEGRATED CIRCUIT

(75) Inventor: Kenji Noda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 455 days.

(21) Appl. No.: 11/544,751

(22) Filed: Oct. 10, 2006

(65) Prior Publication Data

US 2007/0094559 A1 Apr. 26, 2007

(30) Foreign Application Priority Data

Oct. 11, 2005 (JP) ............................. 2005-296586

(51) Int. Cl.
*G01R 31/28* (2006.01)
(52) U.S. Cl. ....................... 714/726; 716/731
(58) Field of Classification Search ................ 713/500; 257/102; 716/17, 4, 12, 10; 714/727, 726, 714/731
See application file for complete search history.

(56) References Cited

U.S. PATENT DOCUMENTS

| | | | |
|---|---|---|---|
| 6,885,043 B2 * | 4/2005 | Smith et al. .................. | 257/202 |
| 6,910,201 B2 * | 6/2005 | Byrn et al. ..................... | 716/17 |
| 7,020,002 B2 | 3/2006 | Yamamoto | |
| 7,032,196 B2 * | 4/2006 | Takeoka et al. ................ | 716/4 |
| 7,047,514 B2 | 5/2006 | Mizuno et al. | |
| 7,120,891 B2 * | 10/2006 | Yamamoto .................... | 716/12 |
| 7,171,600 B2 * | 1/2007 | Takeoka et al. ............. | 714/727 |
| 7,206,957 B2 * | 4/2007 | Aoki et al. ................... | 713/500 |
| 7,348,595 B2 * | 3/2008 | Takeoka et al. ............... | 257/48 |
| 2005/0235239 A1* | 10/2005 | Matsubara ................... | 716/10 |

FOREIGN PATENT DOCUMENTS

JP 3621354 11/2004
JP 2005-123347 A 5/2005

* cited by examiner

*Primary Examiner*—David Ton
(74) *Attorney, Agent, or Firm*—Foley & Lardner LLP (57) ABSTRACT

To provide wiring structure and method capable of supplying a scan clock signal for each clock domain without requesting a user to add a test circuit. The wiring structure of a semiconductor integrated circuit according to an embodiment of the present invention includes: a fixed layer where a common line independent of a user circuit is formed; and a customized layer which is formed on the fixed layer and in which a line dependent on the user circuit is formed. The fixed layer is provided with a scan clock line supplying a scan clock signal for scan test to the selecting circuit, and a clock line supplying an output signal of the selecting circuit to a flip-flop of a scan path, and the customized layer is provided with a user clock line supplying a user clock signal to the selecting circuit.

12 Claims, 5 Drawing Sheets

WIRING STRUCTURE AND METHOD OF SEMICONDUCTOR INTEGRATED CIRCUIT

BACKGROUND OF THE INVENTION

1. Field of the Invention

The present invention relates to wiring structure and method of a semiconductor integrated circuit. In particular, the invention relates to wiring structure and method of a semiconductor integrated circuit having a fixed layer where a common line independent of a user circuit is formed, and a customized layer where a line dependent on the user circuit is formed.

2. Description of Related Art

There has been hitherto known an ASIC (Application Specific Integrated Circuit) as a specific IC customized for a particular user. In a cell-based LSI as a general ASIC, all components should be customized as usage, which places a significant burden on a circuit designer. Thus, it is difficult to avoid such a situation that development costs increase and the development is prolonged.

To overcome such defects, an IC called "structured ASIC" or "master slice LSI" (hereinafter simply referred to as "structured ASIC") has been proposed. The structured ASIC is an LSI a dedicated circuit of which can be designed only by changing a wiring layer. Although a desirable dedicated circuit is downsized, the structured ASIC is advantageous in that the development costs and period are decreased.

For instance, Japanese Patent No. 3621354 or Japanese Unexamined Patent Publication No. 2005-123347 discloses a structured ASIC example. In the semiconductor integrated circuit as disclosed in Japanese Patent No. 3621354, sharable power supply lines, ground lines, test circuit lines, and clock signal lines are formed in a lower wiring layer independently of a user circuit design, and lines customized in accordance with the user circuit design are formed in an upper wiring layer.

Further, Japanese Unexamined Patent Publication No. 2005-123347 discloses a wiring technique. In accordance with the wiring technique, clock tree lines distributing plural clock signals to sequential circuits via each clock selector are previously formed on a fixed layer, and a customized layer overlying the fixed layer is used by a user to wire to supply a control signal to each clock selector.

In general, the semiconductor integrated circuit is subjected to an operational test by use of a tester or the like. Various methods are proposed for the operational test. As an example of the methods, there is a delay test for examining whether or not the circuit can operate at a specific frequency using a scan path. Upon executing this delay test, the semiconductor integrated circuit needs to meet the following conditions.

Condition 1: a particular clock terminal directly supplies a scan clock signal to a sequential circuit such as a flip-flop (FF) circuit.

Condition 2: if there are circuit groups that operate at different clock frequencies, that is, clock domains, the scan clock signals can be independently controlled for each clock domain.

Known as a delay test method using the scan path is a method of applying a pulse corresponding to an intended measurement period to the clock terminal from a tester. In accordance with this method, (a) a predetermined value is set for each FF using the scan path, and then (b) pulses are applied to the clock terminal at intervals of 10 ns if the intended measurement period is, for example, 10 ns (100 MHz) to drive the circuit, and (c) after the circuit operation, a value of each FF is measured using the scan path, and the measurement result is examined. In this way, a series of operations is executed. Here, in the step (b), needless to say, how to control a clock is important, but in the steps (a) and (c), how to control a clock is important. This is because FFs of different clock domains are generally series-connected into one scan path, but in this case, if the FFs operate in accordance with different clocks upon scan shift operation, the scan shift operation itself may end in failure. The other methods may be adopted for the delay test, the clock control is also important in these methods. The above Conditions 1 and 2 need to be met for executing the delay test.

The above Condition 1 is necessary for ensuring that the sequential circuit such as the FF can operate in accordance with a scan clock signal independently of a user circuit design. Further, the above Condition 2 is necessary for ensuring that, in the case of testing a circuit including different clock domains, each clock domain can operate in accordance with a scan clock signal of a predetermined frequency independently of the user circuit design.

Japanese Unexamined Patent Publication No. 2005-123347 that discloses the structured ASIC does not describe a technique about the scan clock. Here, consider that clock lines disclosed in this document are used as scan clock lines.

Figure 4:
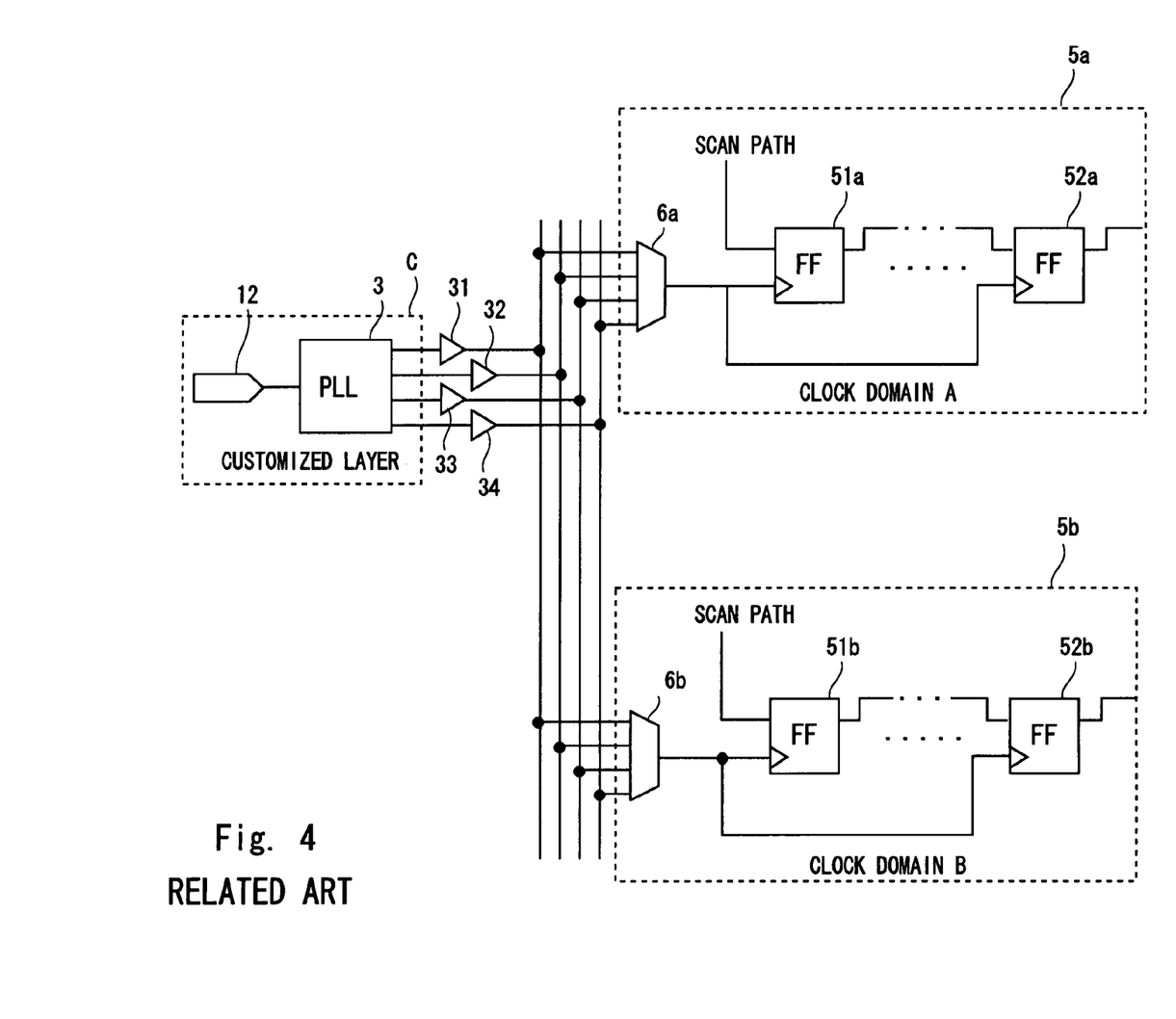
FIG. 4 shows a wiring structure of a semiconductor integrated circuit of the related art.

FIG. 4 shows a circuit produced by adding a PLL (Phase Locked Loop) circuit to the circuit disclosed in Japanese Unexamined Patent Publication No. 2005-123347. This circuit includes a clock domain A (5*a*) and a clock domain B (5*b*). The clock domain A (5*a*) includes a selecting circuit 6*a*, and FFs 51*a* and 52*a*. The clock domain B (5*b*) includes a selecting circuit 6*b*, and FFs 51*b* and 52*b*. The selecting circuits 6*a* and 6*b* receive clock signals through clock buffers 31, 32, 33, and 34. In FIG. 4, the clock signals are output from a PLL circuit 3. The PLL circuit 3 adjusts a clock phase or divides a frequency of a signal input to a clock terminal. In the circuit of FIG. 4, lines between a clock terminal 1 and the PLL circuit 3, and between the PLL circuit 3 and the clock buffers 31, 32, 33, and 34 are formed in a customized layer, and the other lines are formed in a fixed layer beforehand. In the circuit of FIG. 4, a combinational circuit (gating circuit) that turns on/off the clock signal in accordance with a particular control signal may be provided via lines formed in the customized layer in addition to the PLL circuit 3.

However, in the case of adding the PLL circuit 3 or the gating circuit, if a clock signal is input to the clock terminal 1 to execute the scan test, the scan clock signal applied to the clock terminal is not directly input to the FF, so the above Condition 1 is not met. To meet the above Condition 1, a circuit for directly inputting the scan clock signal to the FF at the time of scan test (for example, another circuit for passing the scan clock signal through the PLL circuit or the gating circuit) should be additionally provided through lines on the customized layer.

Figure 5:
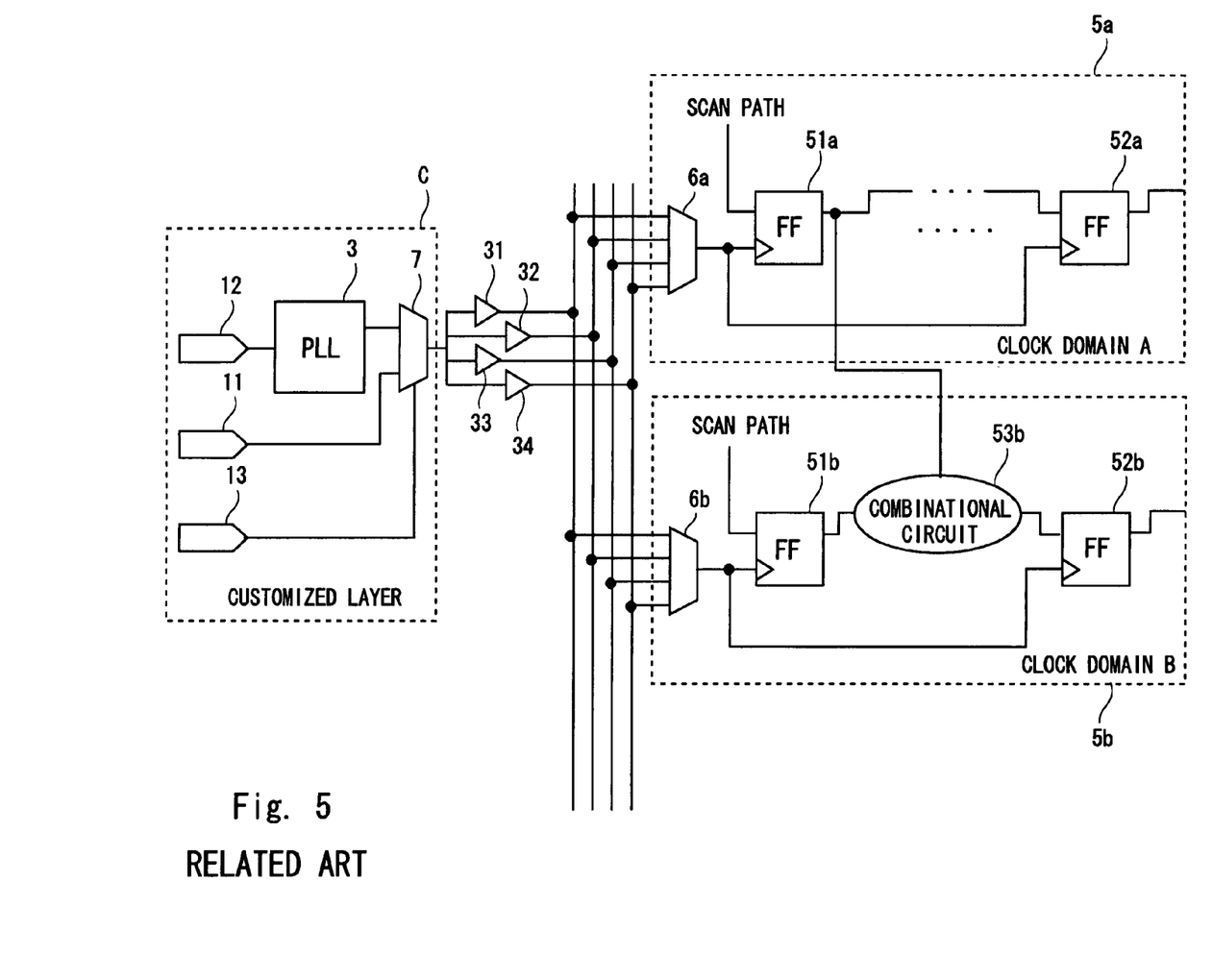
FIG. 5 shows a wiring structure of a semiconductor integrated circuit of the related art.

FIG. 5 shows an example of the circuit configuration including the circuit for passing the scan clock signal through the PLL circuit or the gating circuit to solve the above problem. As shown in FIG. 5, a user lays down lines connected with a selecting circuit 7 for selecting one of an output signal of the PLL circuit 3 and a scan clock input to a scan clock signal terminal in accordance with the control signal input to the scan mode switching terminal 13, between the PLL circuit 3 and the clock buffers 31, 32, 33, and 34.

In the circuit configuration of FIG. 5, upon executing the scan test, the scan clock signals input to a scan clock terminal 11 are distributed to the FFs 51*a*, 52*a*, 51*b*, and 52*b* not through the PLL circuit 3, so the above Condition 1 is fulfilled.

However, in the circuit configuration of FIG. 5, upon the scan test, the same scan clock signals are supplied to all the clock domains, so the above Condition 2 is not fulfilled. For example, provided that a clock frequency of the clock domain A is 100 MHz, and a clock frequency of the clock domain B is 50 MHz, the domains A and B should operate at 100 MHz and 50 MHz, respectively. In the circuit configuration of FIG. 5, however, it is difficult to test the two domains at a time. As a result, at least two tests should be executed: a test where a 50-MHz scan clock signal is supplied to both the clock domains A and B, and a test where a 100-MHz scan clock signal is supplied to both the clock domains A and B.

Further, the circuit configuration of FIG. 5 includes a path extending from the FF 51$a$ of the clock domain A to a combinational circuit 53$b$ of the clock domain B. In general, it is known that, if there is a logic dependency between different clock domains, a delay test pattern is difficult to generate. For example, in the illustrated example of FIG. 5, a predetermined value is set to the FFs 51$a$ and 51$b$ using the scan path and then, the circuit is driven at 50 MHz and 100 MHz to examine the delay test result based on a value of the FF 52$b$. In this case, since the clock domain A has an operating frequency of 100 MHz that is higher than 50 MHz as an operating frequency of the clock domain B, there is a possibility that a value of the FF 51$a$ itself is changed before the FF 52$b$ captures a value derived from the preset value of the FF 51$a$. In this case, the resultant value may be different from an expected value albeit a normal operation. In such a case, the test pattern generation is difficult because a logic circuit connected with an input terminal of the FF 51$a$ needs to be considered. Accordingly, in the circuit configuration of FIG. 5, the delay test should be carried out for each clock domain. More specifically, it is necessary to exert control such as stopping the clock signal supply to the clock domain A during the delay test of the clock domain B. However, the clock signal supplying method of FIG. 5 has difficulty in independently executing the delay test every clock domain.

SUMMARY OF THE INVENTION

A wiring structure of a semiconductor integrated circuit according to an aspect of the present invention includes: a fixed layer where a common line independent of a user circuit and a basic cell including a selecting circuit are formed; and a customized layer which is formed on the fixed layer and in which a line dependent on the user circuit is formed, the fixed layer being provided with a scan clock line supplying a scan clock signal for scan test to the selecting circuit, and a clock line supplying an output signal of the selecting circuit to a circuit of a scan path, and the customized layer is provided with a user clock line supplying a user clock signal to the selecting circuit. According to this wiring structure, a user does not need to add a test circuit, and a burden on the user is reduced.

In particular, it is preferable that the selecting circuit and the clock line be provided for each clock domain. With this arrangement, a scan clock signal can be supplied for each clock domain.

According to another aspect of the invention, a wiring method of a semiconductor integrated circuit including: a fixed layer where a common line independent of a user circuit and a basic cell including a selecting circuit are formed; and a customized layer which is formed on the fixed layer and in which a line dependent on the user circuit is formed, includes: forming a scan clock line supplying a scan clock signal for scan test to the selecting circuit, and a clock line supplying an output signal of the selecting circuit to a circuit of a scan path in the fixed layer; and forming a user clock line supplying a user clock signal to the selecting circuit in the customized layer. According to this wiring method, a user does not need to add a test circuit, and a burden on the user is reduced.

In particular, it is preferable that the selecting circuit and the clock line be provided for each clock domain. With this arrangement, a scan clock signal can be supplied for each clock domain.

According to the present invention, it is possible to provide wiring structure and method for a semiconductor integrated circuit including: a fixed layer where a line as a common portion independent of a user circuit is formed; and a customized layer where a line dependent on the user circuit is formed, which make it unnecessary for a user to add a test circuit. Further, it is possible to provide wiring structure and method which can supply a scan clock signal for each clock domain.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

A semiconductor integrated circuit according to a first embodiment of the present invention is configured by a semiconductor chip including multiple wiring layers. The wiring layers include fixed layers and customized layers. The fixed layer is formed on the semiconductor chip, and the customized layer is formed on the fixed layer. Connecting lines are formed on the semiconductor chip for forming a transistor or basic cell.

For example, considering a semiconductor chip including 5 wiring layers, a first wiring layer M1, a second wiring layer M2, and a third wiring layer M3 serve as the fixed layers, and a fourth wiring layer M4 and a fifth wiring layer M5 serve as the customized layers.

In the fixed layers, lines prepared for forming basic cells (logic blocks) that constitute a flip-flip (FF) or logic cell, power supply lines, ground lines, test circuit lines, or clock signal lines are formed. That is, the lines that configure a circuit sharable among users independently of a user circuit are formed in the fixed layers by use of a common mask.

In the customized layers, lines that are freely designed by a user and are dependent on the user circuit are formed by use of individual masks. Hence, different lines are formed in the customized layer in accordance with user specifications.

Figure 1:
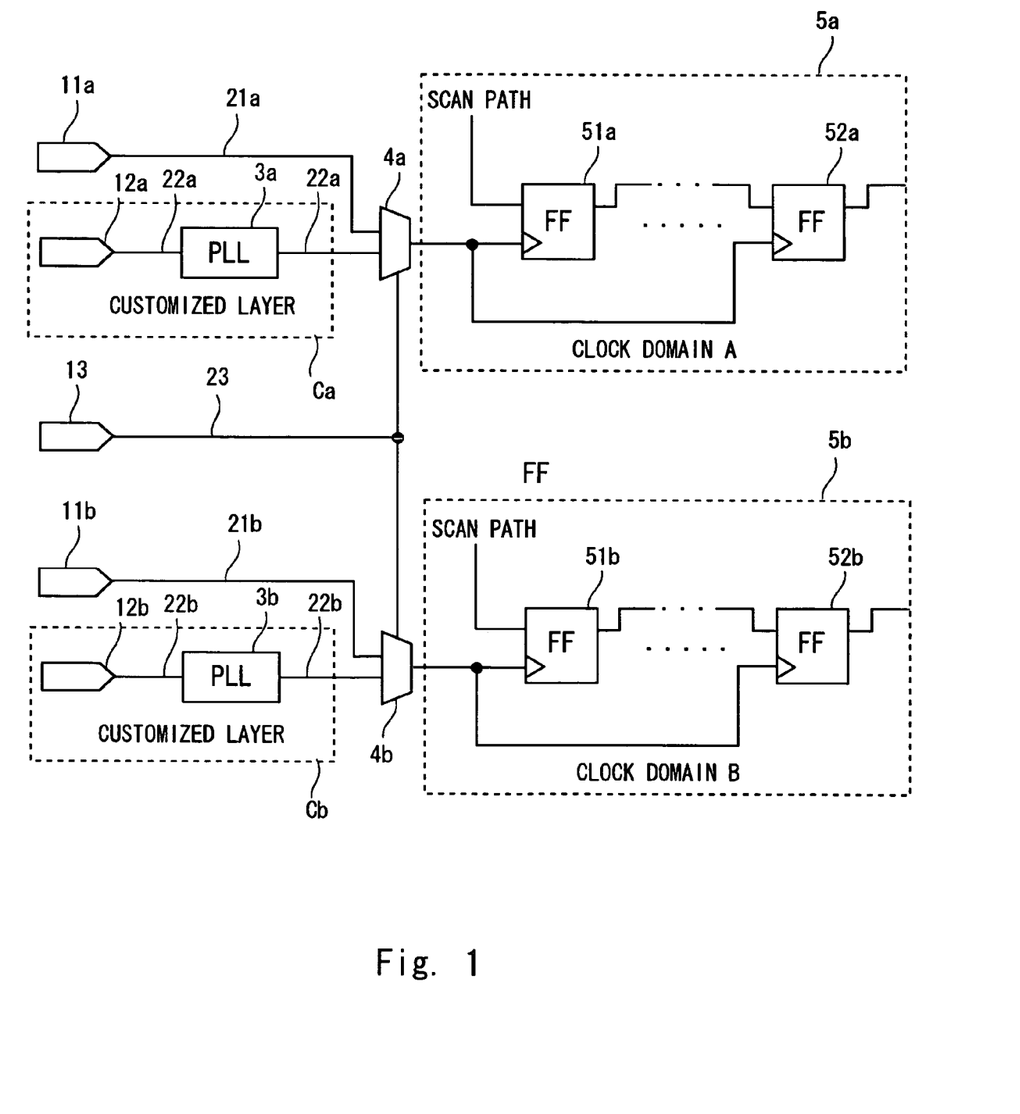
FIG. 1 shows a wiring structure of a semiconductor integrated circuit according to a first embodiment of the present invention.

FIG. 1 shows the wiring structure of the semiconductor integrated circuit of the first embodiment. In FIG. 1, all lines but lines of customized layers Ca and Cb are formed in the fixed layers and prepared in advance.

The semiconductor integrated circuit of this embodiment includes two clock domains: a clock domain A (5*a*) and a clock domain B (5*b*). Circuits of the clock domain A (5*a*) operate by being supplied with a clock signal of 50 MHz, and circuits of the clock domain B (5*b*) operate by being supplied with a clock signal of 100 MHz, for instance.

A scan clock terminal 11*a* is connected with one input terminal of a selecting circuit 4*a* through a scan clock line 21*a* on the fixed layer. A user clock terminal 12*a* is connected with an input terminal of a PLL circuit 3*a* through a user clock line 22*a* on the customized layer Ca. Further, an output terminal of the PLL circuit 3*a* is connected with the other input terminal of the selecting circuit 4*a* through the user clock line 22*a* on the customized layer Ca. A scan mode switching terminal 13 is connected with a control signal input terminal of the selecting circuit 4*a* through a control line 23 on the fixed layer.

The selecting circuit 4*a* is, for example, a multiplexer or a selector to select one of the signals input to the two input terminals in accordance with a control signal input to the control signal input terminal and output the selected signal alone. The following selecting circuit has a similar function. The output terminal of the selecting circuit 4*a* is connected with a clock input terminal of FFs 51*a* and 52*a* that constitute a scan path in the clock domain A (5*a*) through a clock line on the fixed layer.

The selecting circuit 4*a* selects a scan clock signal input to the scan clock terminal 11*a* or a user clock signal input to the user clock terminal 12*a* in accordance with a control signal input to the scan mode switching terminal 13 to supply the selected clock signal to the FFs 51*a* and 52*a* of the clock domain A.

A scan clock terminal 11*b* is connected with one input terminal of a selecting circuit 4*b* through a scan clock line 21*b* on the fixed layer. A user clock terminal 12*b* is connected with an input terminal of a PLL circuit 3*b* through a user clock line 22*b* on the customized layer Ca. Further, the output terminal of the PLL circuit 3*b* is connected with the other input terminal of the selecting circuit 4*b* through the user clock line 22*b* on the customized layer Cb. The scan mode switching terminal 13 is also connected with a control signal input terminal of a selecting circuit 4*b* through a control line 23 on the fixed layer. The output terminal of the selecting circuit 4*b* is connected with a clock input terminal of FFs 51*b* and 52*b* constituting a scan path in the clock domain B (5*b*) through a clock line on the fixed layer.

Incidentally, as a scanning flip-flop example, there are conceivable a multiplexer-equipped flip-flop, a flip-flop that operates with a duplex clock of master/slave modes used in an LSSD (Level-Sensitive Scan Design), and the like. The present invention is applicable to every type of flip-flops.

The selecting circuit 4*b* selects a scan clock signal input to the scan clock terminal 11*b* and a user clock signal input to the user clock terminal 12*b* in accordance with a control signal input to the scan mode switching terminal 13 to supply the selected clock signal to the FFs 51*b* and 52*b* of the clock domain B.

As shown in FIG. 1, according to the embodiment of the present invention, in order to arrange a selecting circuit for switching a user clock signal and a scan clock for each clock domain, at the root of the clock lines, the following lines (1), (2), and (3) connected with the selecting circuit is previously formed in the fixed layer as a common portion independent of a user circuit.

(1) Scan clock lines 21*a* and 21*b* connecting one input terminals of the selecting circuits 4*a* and 4*b* of the clock domains 5*a* and 5*b* with the scan clock terminals 11*a* and 11*b* of the clock domains 5*a* and 5*b*

(2) Control line 23 connecting a control signal input terminal for switchingly inputting a signal to the selecting circuit 4*a* or 4*b* with a scan mode switching terminal (3) Clock lines connecting output terminals of the selecting circuits 4*a* and 4*b* of the clock domains 5*a* and 5*b* with clock terminals of sequential circuits belonging to the clock domains 5*a* and 5*b*, such as the FF 51.

In the circuit of FIG. 1, in the case of executing the scan test, the test can be carried out for each clock domain. First, in the case of executing the scan test for the clock domain A, the selecting circuit 4*a* selects a signal input from the scan clock terminal 11*a* and outputs the selected signal to the FFs 51*a* and 52*a* in accordance with a control signal input to the scan mode switching terminal 13. Next, in the case of executing the scan test for the clock domain B, the selecting circuit 4*b* selects a signal input from the scan clock terminal 11*b* and outputs the selected signal to the FFs 51*b* and 52*b* in accordance with a control signal input to the scan mode switching terminal 13.

In this way, the circuit of the first embodiment can directly supply scan clock signals from the scan clock terminals 11*a* and 11*b* to the FFs 51*a*, 52*a*, 51*b*, and 52*b* and thus meets the above Condition 1. In addition, the circuit can independently control the scan clock signals for each clock domain and thus meets the above Condition 2.

As described above, in the wiring structure of the first embodiment, clock lines connected with every sequential circuit such as the flip-flops are provided with the selecting circuits for switching the scan clock signal and the user clock signal, which are previously formed in the fixing layers as a common portion independent of a user circuit. Hence, a user does not need to add a test circuit. Further, the selecting circuit is provided for each clock domain, so each clock domain can be independently subjected to the test with a scan clock of a predetermined frequency.

Second Embodiment

Figure 2:
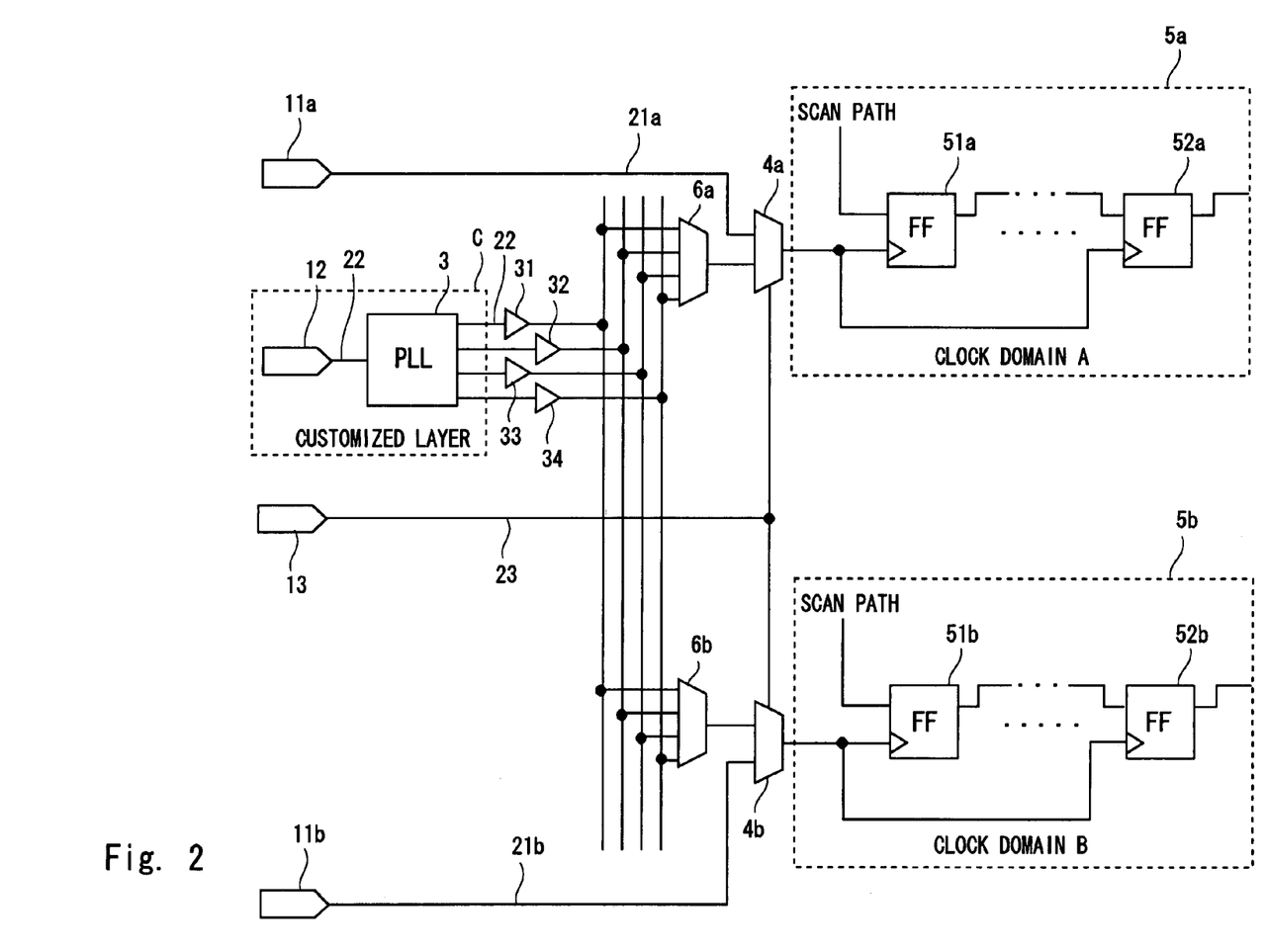
FIG. 2 shows a wiring structure of a semiconductor integrated circuit according to a second embodiment of the present invention.

FIG. 2 shows the wiring structure of a semiconductor integrated circuit according to a second embodiment of the present invention. The semiconductor integrated circuit of the second embodiment is the same as the circuit of the first embodiment except the circuit configuration between the user clock terminal 12 and the input terminals of the selecting circuit 4.

The user clock terminal 12 is connected with an input terminal of the PLL circuit 3 through lines on the customized layer C. The PLL circuit 3 generates four (clock) signals different in phase and/or frequency in accordance with the input user clock and outputs the generated signals from four output terminals. Further, the output terminal of the PLL circuit 3 is connected with the clock buffers 31, 32, 33, and 34 through the line 22 of the customized layer C. The output terminals of the clock buffers 31, 32, 33, and 34 are connected with the selecting circuits 6*a* and 6*b* through lines on the fixed layer. The selecting circuits 6*a* and 6*b* are, for example, multiplexers or selectors to select one of four signals input to the four input terminals in accordance with a control signal input to a not shown control signal input terminal to output only the selected one. The output terminal of the selecting circuit 6a is connected with the other input terminal of the selecting circuit 4a. Further, the output terminal of the selecting circuit 6b is connected with the other input terminal of the selecting circuit 4b. The scan mode switching terminal 13 is connected with the control signal input terminal of the selecting circuits 4a and 4b through the control line 23 on the fixed layer.

As shown in FIG. 2, in the embodiment of the present invention, in order to arrange a selecting circuit for switching a user clock signal and a scan clock for each clock domain, at the root of the clock lines, the following lines (1), (2), and (3) connected with the selecting circuit is previously formed in the fixed layer as a common portion independent of a user circuit.

(1) Scan clock lines 21a and 21b connecting one input terminals of the selecting circuits 4a and 4b of the clock domains 5a and 5b with the scan clock terminals 11a and 11b of the clock domains 5a and 5b (2) Control line 23 connecting a control signal input terminal for switchingly inputting a signal to the selecting circuit 4a or 4b and the selecting circuit 6a or 6b with a scan mode switching terminal (3) Clock lines connecting output terminals of the selecting circuits 4a and 4b of the clock domains 5a and 5b with clock terminals of sequential circuits belonging to the clock domains 5a and 5b, such as the FF 51.

In the circuit of FIG. 2, upon executing the scan test, the scan test can be carried out fro each clock domain. First, upon executing the scan test for the clock domain A, the selecting circuit 4a selects a signal input from the scan clock terminal 11a and outputs the selected signal to the FFs 51a and 52a in accordance with a control signal input to the scan mode switching terminal 13. Next, upon executing the scan test for the clock domain B, the selecting circuit 4b selects a signal input from the scan clock terminal 11b and outputs the selected signal to the FFs 51b and 52b in accordance with a control signal input to the scan mode switching terminal 13.

In this way, the circuit of the second embodiment can directly supply scan clock signals from the scan clock terminals 11a and 11b to the FFs 51a, 52a, 51b, and 52b and thus meets the above Condition 1. Further, the circuit can independently control the scan clock signal for each clock domain and thus meets the above Condition 2.

As described above, in the wiring structure of the second embodiment, clock lines connected with every sequential circuit such as the flip-flops are provided with the selecting circuits for switching the scan clock signal and the user clock signal, which are previously formed in the fixing layers as a common portion independent of a user circuit. Hence, a user does not need to add a test circuit. Further, the selecting circuit is provided for each clock domain, so each clock domain can be independently subjected to the test with a scan clock of a predetermined frequency.

Third Embodiment

Figure 3:
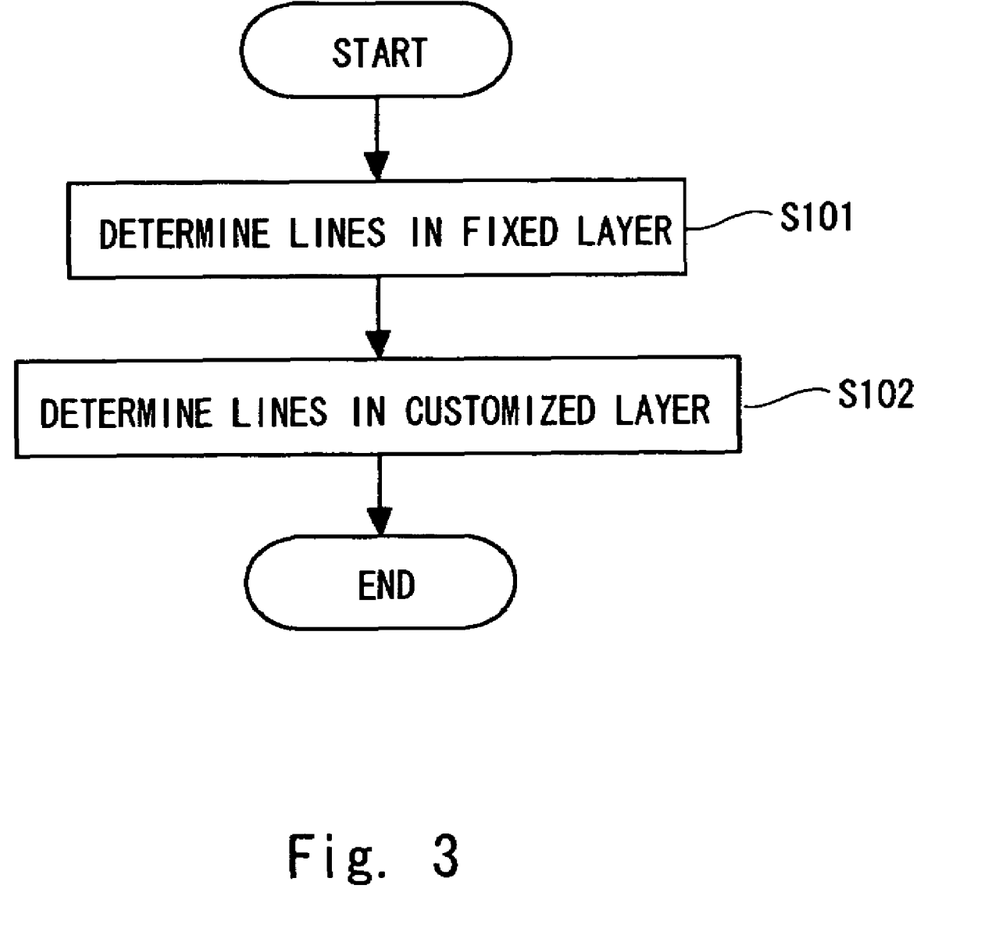
FIG. 3 is a flowchart of a wiring method of a semiconductor integrated circuit according to a third embodiment of the present invention.

Referring to FIG. 3, a wiring method of a semiconductor integrated circuit according to a third embodiment of the present invention is described. The final wiring structure is illustrated in FIGS. 1 and 2, for instance. First, sharable lines of a fixed layer out of the lines connecting between transistors that constitutes a basic cell are designed and determined (S101) Next, lines of the customized layer are designed and determined in accordance with user specifications (S102).

Masks are formed based on the determined wiring structure of the fixed layer or customized layer, and layers are formed on a semiconductor wafer using the masks.

It is apparent that the present invention is not limited to the above embodiment that may be modified and changed without departing from the scope and spirit of the invention.

What is claimed is:

1. A wiring structure of a semiconductor integrated circuit, comprising:
    a fixed layer where a common line independent of a user circuit and a basic cell including a selecting circuit are formed; and
    a customized layer which is formed on the fixed layer and in which a line dependent on the user circuit is formed,
    the fixed layer being provided with a scan clock line supplying a scan clock signal for scan test to the selecting circuit, and a clock line supplying an output signal of the selecting circuit to a circuit of a scan path, and
    the customized layer is provided with a user clock line supplying a user clock signal to the selecting circuit.

2. The wiring structure of a semiconductor integrated circuit according to claim 1, wherein the selecting circuit and the clock line are provided for each clock domain.

3. The wiring structure of a semiconductor integrated circuit according to claim 2, wherein the scan clock line is provided for each selecting circuit in a one-to-one relationship.

4. The wiring structure of a semiconductor integrated circuit according to claim 1, wherein the user clock line supplies a user clock signal to the selecting circuit through a PLL circuit or a gating circuit.

5. The wiring structure of a semiconductor integrated circuit according to claim 1, wherein a line supplying a user clock signal input from the user clock line to a plurality of the selecting circuits is formed in the fixed layer.

6. The wiring structure of a semiconductor integrated circuit according to claim 1, wherein a line supplying a plurality of user clock signals different in at least one of a phase and a frequency output from a PLL circuit that receives a user clock signal from the user clock line to generate the plurality of user clock signals, to a plurality of the selecting circuits through a clock selecting circuit, is formed in the fixed layer.

7. A wiring method of a semiconductor integrated circuit including: a fixed layer where a common line independent of a user circuit and a basic cell including a selecting circuit are formed; and a customized layer which is formed on the fixed layer and in which a line dependent on the user circuit is formed, comprising:
    forming a scan clock line supplying a scan clock signal for scan test to the selecting circuit, and a clock line supplying an output signal of the selecting circuit to a circuit of a scan path in the fixed layer; and
    forming a user clock line supplying a user clock signal to the selecting circuit in the customized layer.

8. The wiring method of a semiconductor integrated circuit according to claim 7, wherein the selecting circuit and the clock line are provided for each clock domain.

9. The wiring method of a semiconductor integrated circuit according to claim 8, wherein the scan clock line is provided for each selecting circuit in a one-to-one relationship.

10. The wiring method of a semiconductor integrated circuit according to claim 7, wherein the user clock line supplies a user clock signal to the selecting circuit through a PLL circuit or a gating circuit.

11. The wiring method of a semiconductor integrated circuit according to claim 7, wherein a line supplying a user clock signal input from the user clock line to a plurality of the selecting circuits is formed in the fixed layer.

12. The wiring method of a semiconductor integrated circuit according to claim 7, wherein a line supplying a plurality of user clock signals different in at least one of a phase and a frequency output from a PLL circuit that receives a user clock signal from the user clock line to generate the plurality of user clock signals, to a plurality of the selecting circuits through a clock selecting circuit, is formed in the fixed layer.

* * * * *